US012676636B2

(12) United States Patent
Higashi et al.

(10) Patent No.: US 12,676,636 B2
(45) Date of Patent: Jul. 7, 2026

(54) COMMUNICATION SYSTEM, COMMUNICATION DEVICE AND COMMUNICATION METHOD

(71) Applicant: Kioxia Corporation, Tokyo (JP)

(72) Inventors: Hirotaka Higashi, Kawasaki (JP); Manabu Watanabe, Kawasaki (JP); Junji Wadatsumi, Tokyo (JP)

(73) Assignee: Kioxia Corporation, Tokyo (JP)

( * ) Notice: Subject to any disclaimer, the term of this patent is extended or adjusted under 35 U.S.C. 154(b) by 8 days.

(21) Appl. No.: 18/882,535

(22) Filed: Sep. 11, 2024

(65) Prior Publication Data

US 2025/0096936 A1 Mar. 20, 2025

(30) Foreign Application Priority Data

Sep. 19, 2023 (JP) ................................. 2023-151431

(51) Int. Cl.
*H03M 13/35* (2006.01)
*H04L 1/00* (2006.01)
*H04L 1/1607* (2023.01)

(52) U.S. Cl.
CPC ........ *H03M 13/353* (2013.01); *H04L 1/0009* (2013.01); *H04L 1/0072* (2013.01); *H04L 1/1657* (2013.01)

(58) Field of Classification Search
CPC .. H03M 13/353; H04L 1/0009; H04L 1/0072; H04L 1/1657; H04L 2001/0095
See application file for complete search history.

(56) References Cited

U.S. PATENT DOCUMENTS

| | | | | |
|---|---|---|---|---|
| 7,957,173 B2 * | 6/2011 | Kim | .......................... | G11C 7/00 |
| | | | | 365/191 |
| 11,516,319 B2 | 11/2022 | Watanabe | | |
| 2007/0209057 A1 * | 9/2007 | Musson | ................. | H04H 20/63 |
| | | | | 725/111 |

(Continued)

FOREIGN PATENT DOCUMENTS

| | | |
|---|---|---|
| JP | 2006-352499 A | 12/2006 |
| JP | 2010-537326 A | 12/2010 |

(Continued)

OTHER PUBLICATIONS

Q. Yu and P. Ampadu, "Adaptive Error Control for NoC Switch-to-Switch Links in a Variable Noise Environment," 2008 IEEE International Symposium on Defect and Fault Tolerance of VLSI Systems, Cambridge, MA, USA, 2008, pp. 352-360, (Year: 2008).*

*Primary Examiner* — Cynthia Britt

(74) *Attorney, Agent, or Firm* — Oblon, McClelland, Maier & Neustadt, L.L.P.

(57) ABSTRACT

According to one embodiment, a communication system includes a host controller, a plurality of communication devices, and a communication path coupling the host controller and the communication devices in a ring shape and configured to transmit a communication frame for serial communications, wherein the host controller and the communication devices each includes an ECC circuit configured to detect and correct an error and having a variable error correction capability, and the host controller is configured to set an error correction capability of the ECC circuit in accordance with an error caused in the communication path.

20 Claims, 10 Drawing Sheets

(56)                    References Cited

U.S. PATENT DOCUMENTS

| 2009/0063786 A1 | 3/2009 | Oh |
| 2018/0006669 A1* | 1/2018 | Yeh .................... H03M 13/2912 |
| 2018/0076829 A1* | 3/2018 | Ueki ...................... G06F 11/073 |
| 2019/0158125 A1* | 5/2019 | Carlough .............. H04L 1/0041 |
| 2020/0076532 A1* | 3/2020 | Pandey ................. H04L 1/0011 |
| 2020/0117539 A1* | 4/2020 | Sun ......................... G11C 29/52 |
| 2024/0323045 A1 | 9/2024 | Higashi et al. |

FOREIGN PATENT DOCUMENTS

| JP | 2021-150878 A | 9/2021 |
| JP | 2024-134188 A | 10/2024 |

* cited by examiner

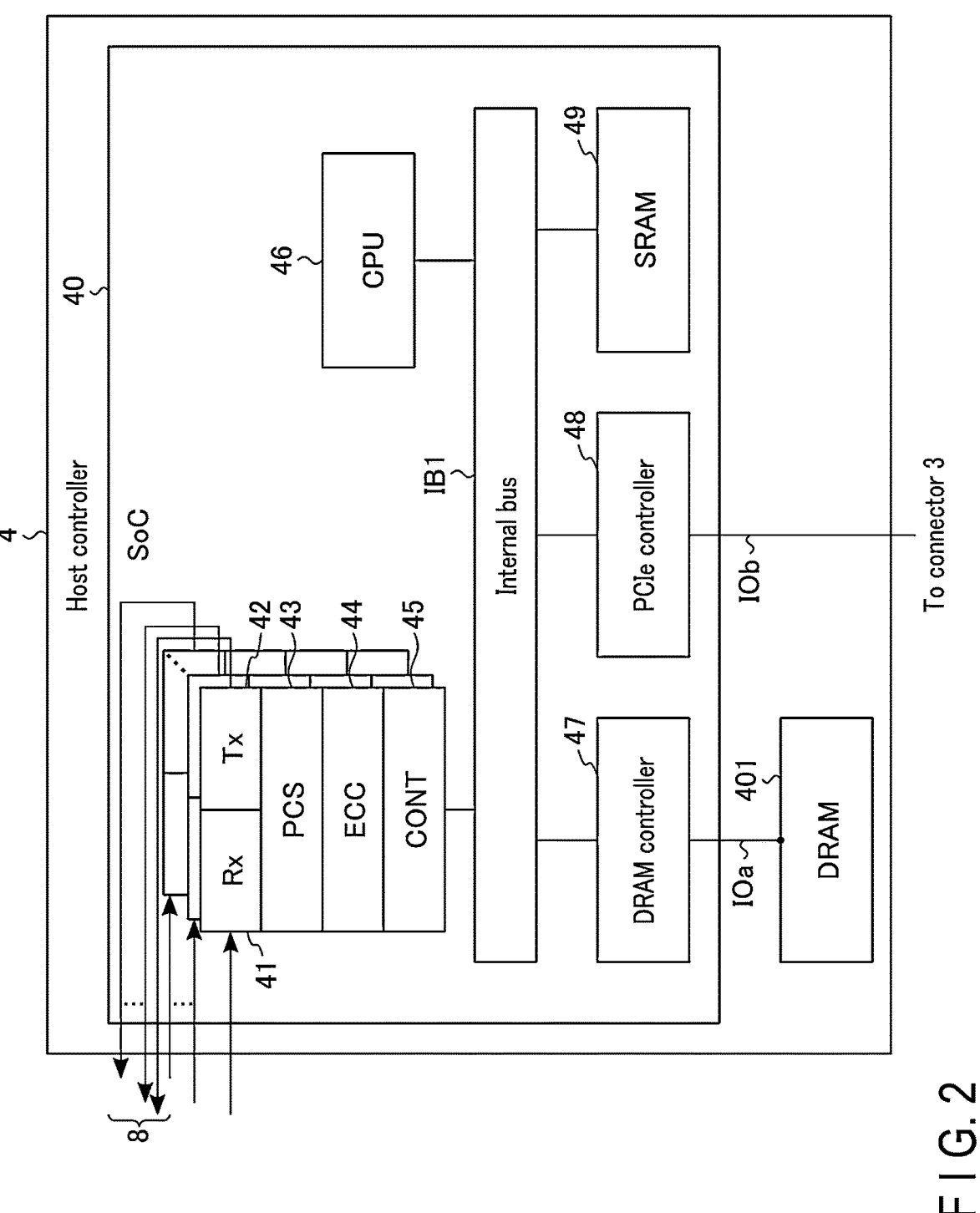
F I G. 2

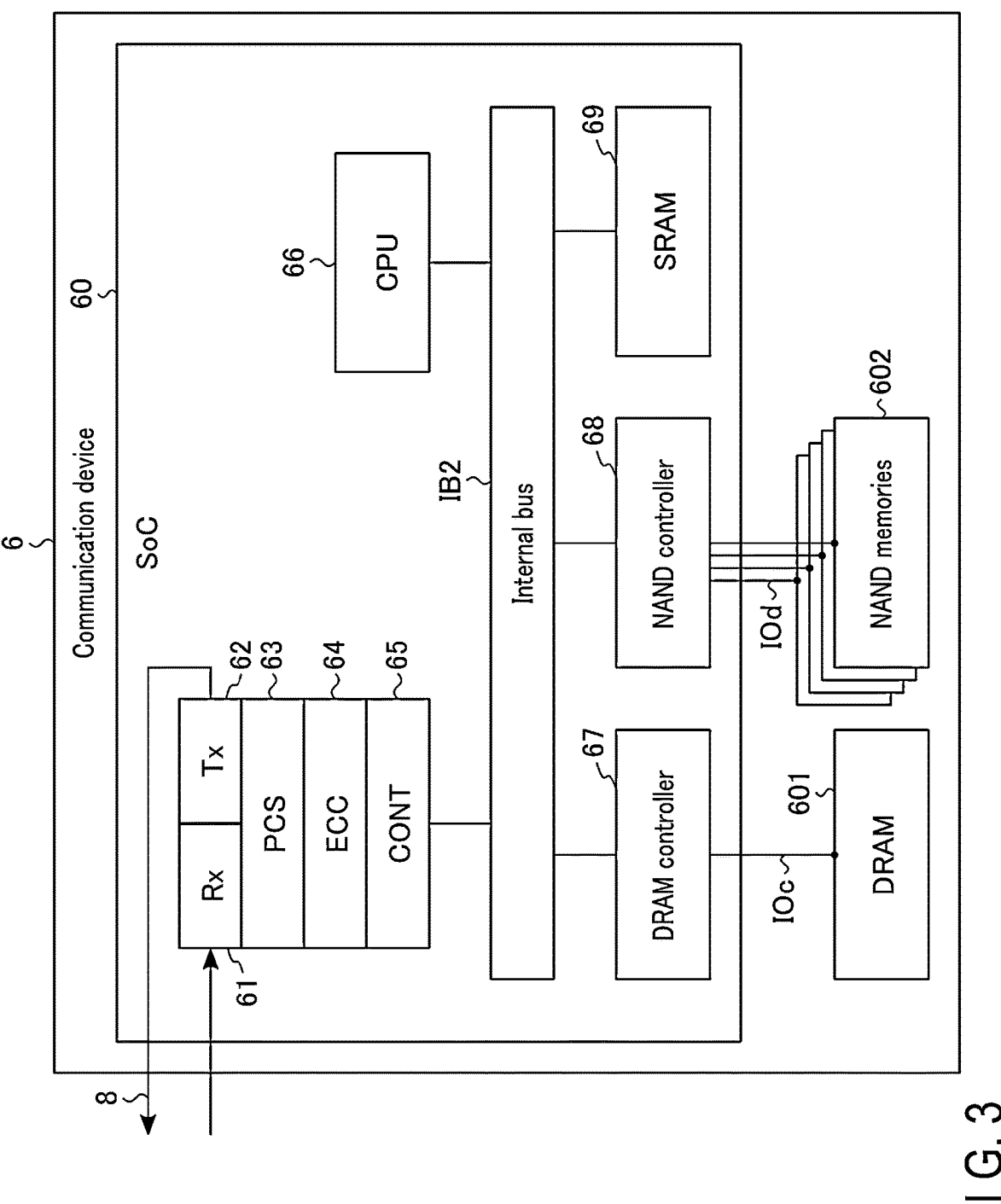
F I G. 3

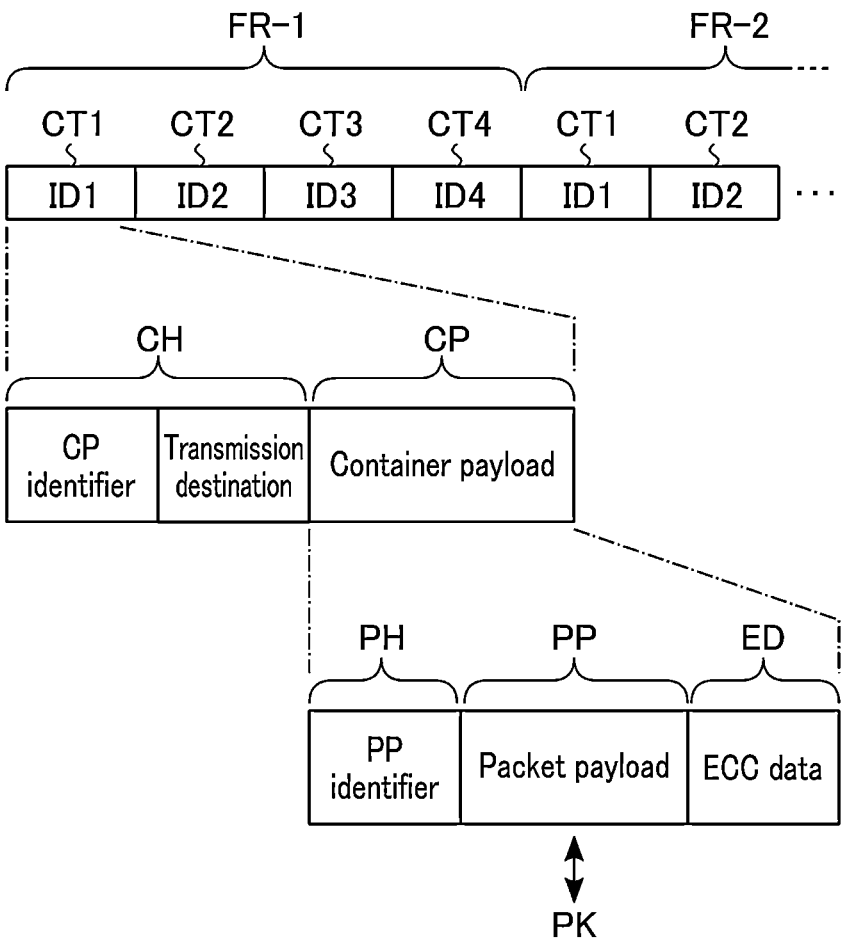
F I G. 4

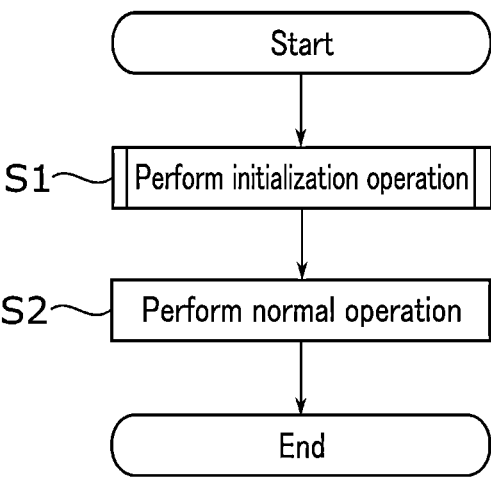
F I G. 5

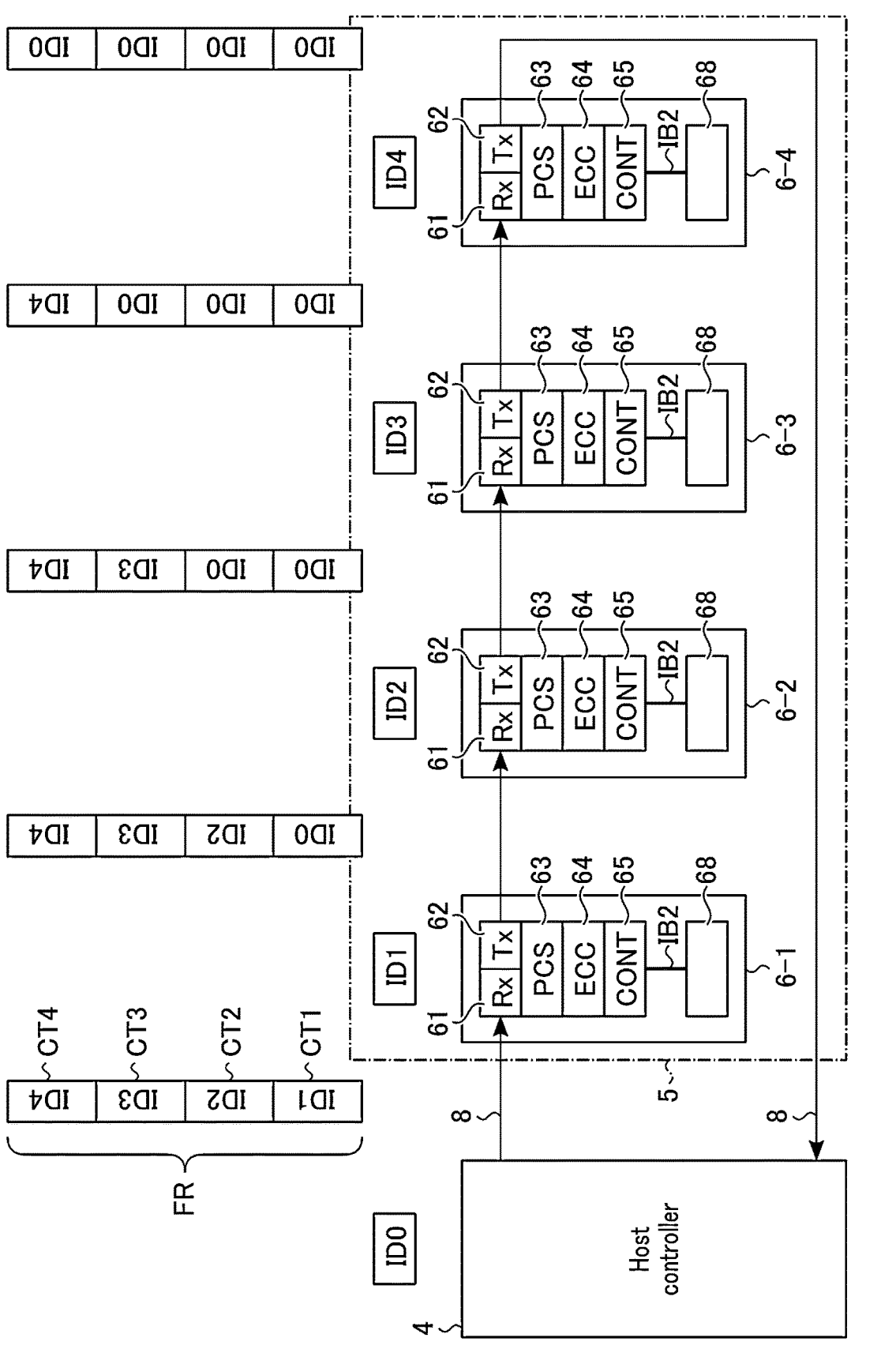
F I G. 6

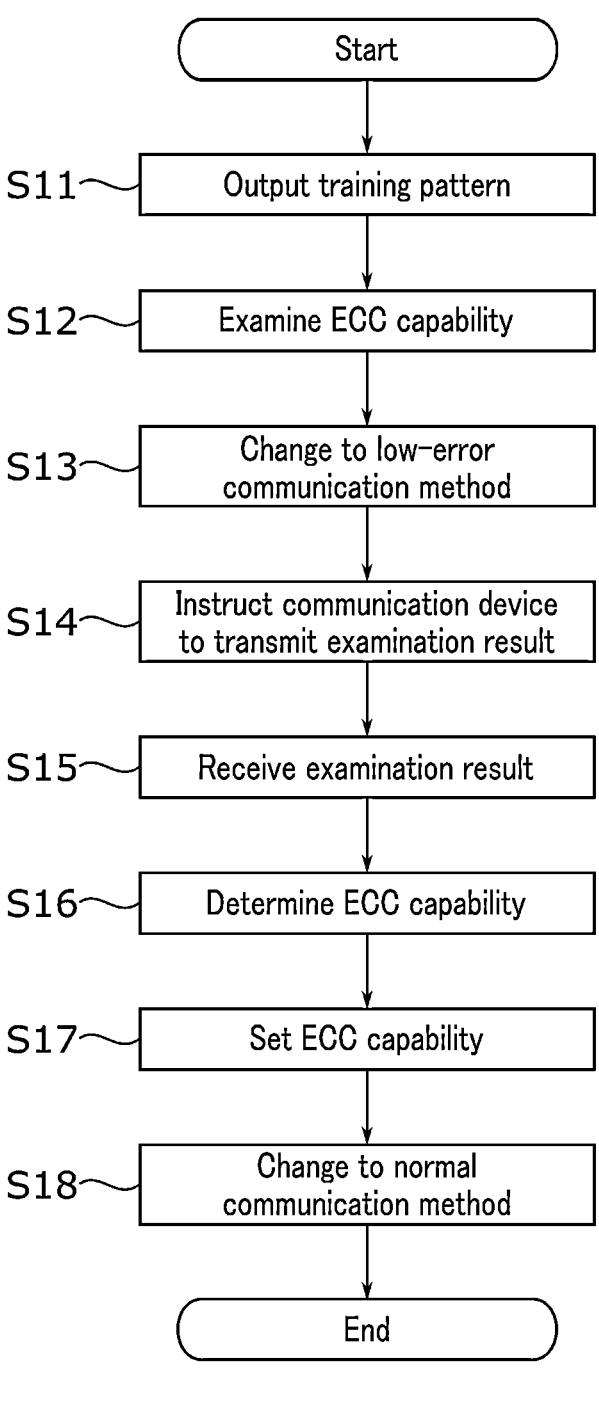
F I G. 7

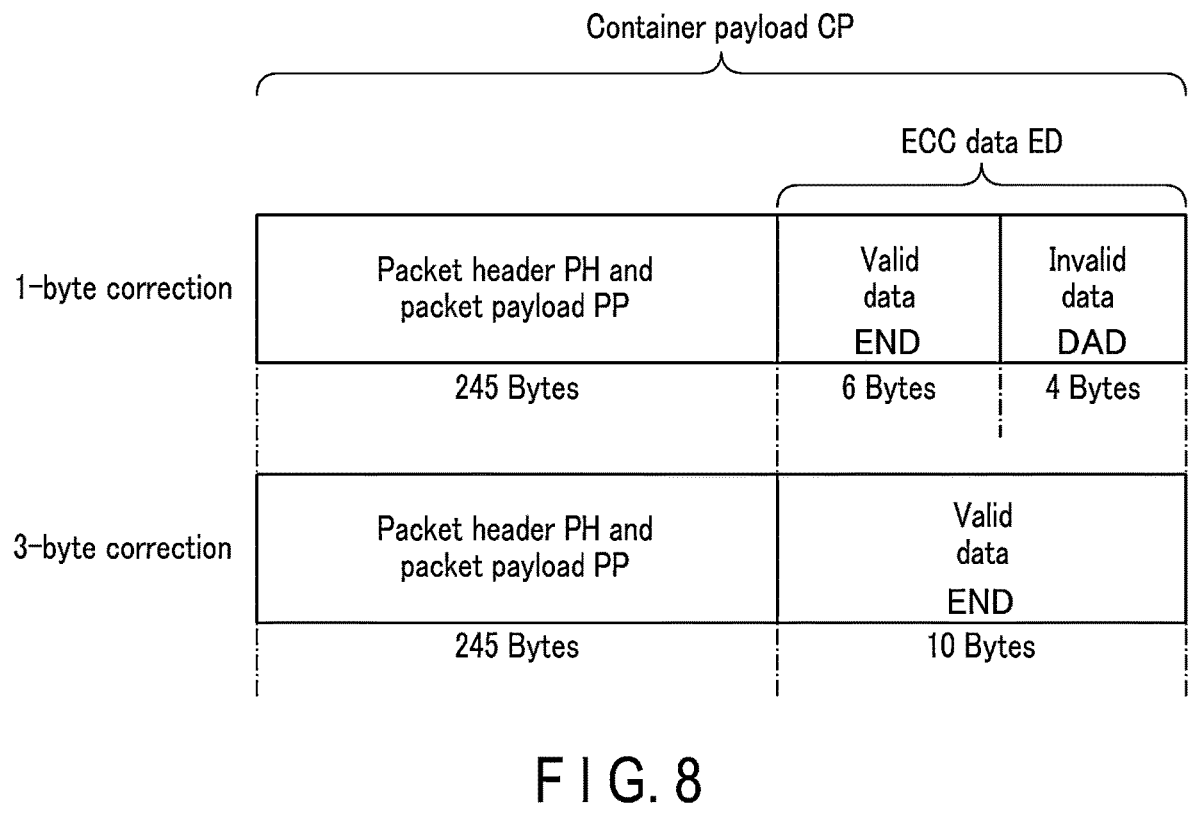

Container payload CP

ECC data ED

| | | Valid data END | Invalid data DAD |
|---|---|---|---|
| 1-byte correction | Packet header PH and packet payload PP | | |
| | 245 Bytes | 6 Bytes | 4 Bytes |

| | | Valid data END |
|---|---|---|
| 3-byte correction | Packet header PH and packet payload PP | |
| | 245 Bytes | 10 Bytes |

F I G. 8

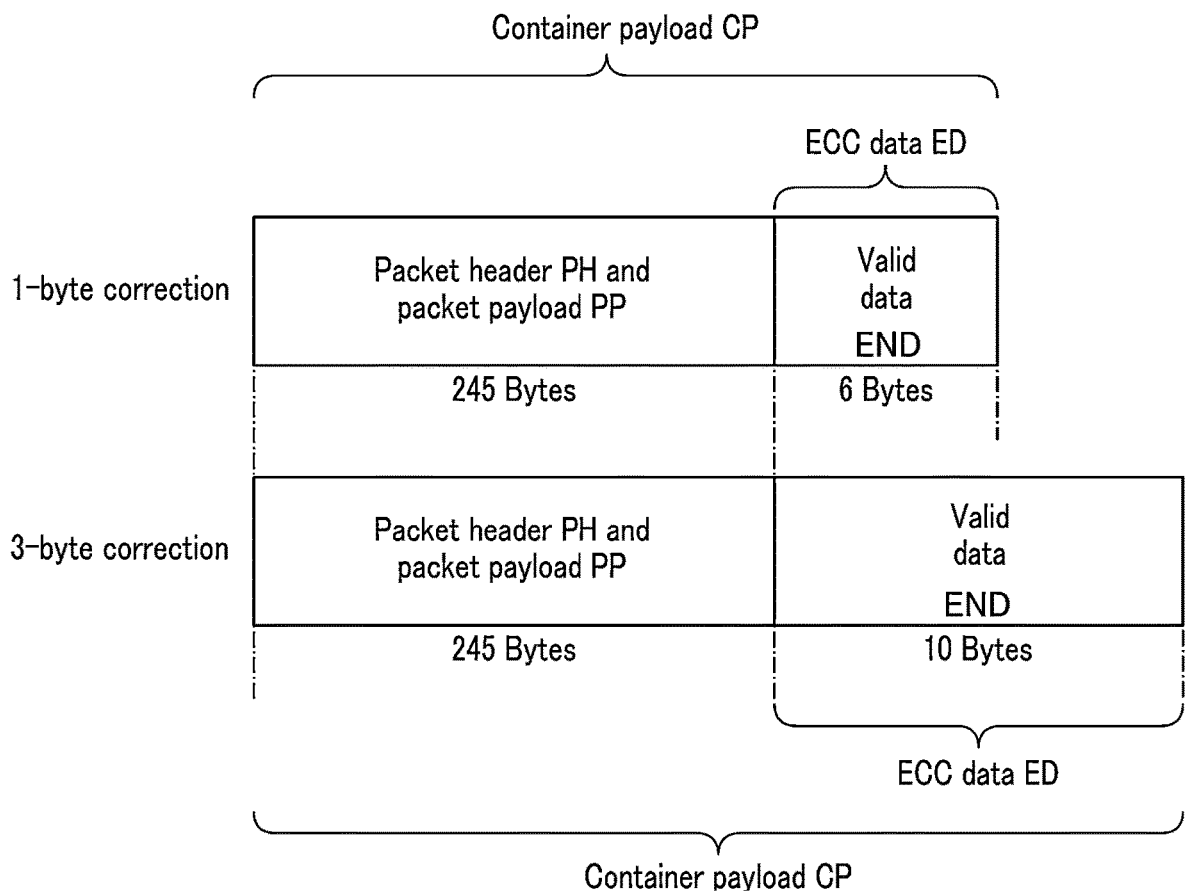
F I G. 9

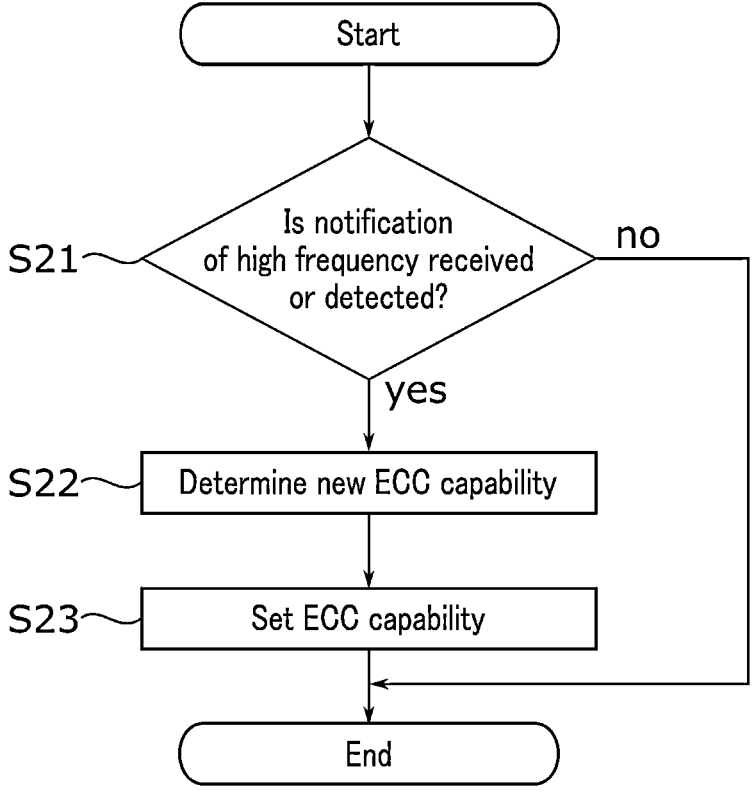
F I G. 10

COMMUNICATION SYSTEM, COMMUNICATION DEVICE AND COMMUNICATION METHOD

CROSS-REFERENCE TO RELATED APPLICATION

This application is based upon and claims the benefit of priority from Japanese Patent Application No. 2023-151431, filed Sep. 19, 2023, the entire contents of which are incorporated herein by reference.

FIELD

Embodiments described herein relate generally to a communication system, a communication device and a communication method.

BACKGROUND

There is a communication system including a host controller and a plurality of communication devices. In this communication system, a coupling method of coupling the host controller and the communication devices in a ring shape coupling is known.

BRIEF DESCRIPTION OF THE DRAWINGS

FIG. 2 is a block diagram of a host controller included in the communication system according to the first embodiment.

FIG. 3 is a block diagram of a communication device included in the communication system according to the first embodiment.

FIG. 4 is a diagram showing an example of a communication frame treated in the communication system according to the first embodiment.

FIG. 5 is a flowchart showing an operation of the communication system according to the first embodiment.

FIG. 6 is a diagram showing an example of transmission of the communication frame in a ring shape coupling of the communication system according to the first embodiment.

FIG. 7 is a flowchart showing an initial setting operation of the communication system according to the first embodiment.

FIG. 8 is a diagram showing an example of a configuration of a container payload of a communication system according to a second embodiment.

FIG. 9 is a diagram showing an example of a configuration of a container payload of a communication system according to a third embodiment.

FIG. 10 is a flowchart showing a resetting operation of a communication system according to a fourth embodiment.

DETAILED DESCRIPTION

Figure 1:
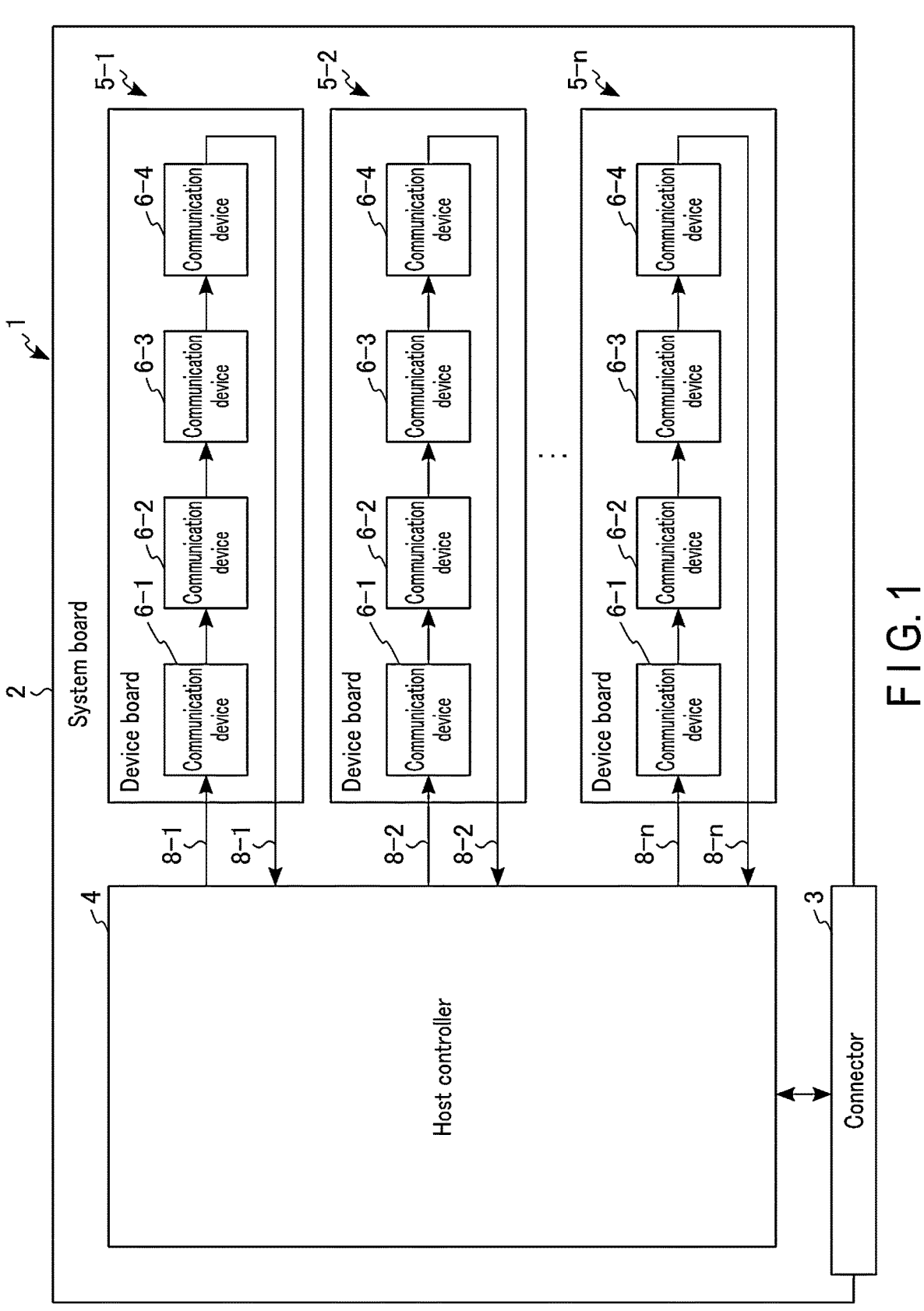
FIG. 1 is a block diagram showing an overall configuration of a communication system according to a first embodiment.

In general, according to one embodiment, a communication system includes a host controller, a plurality of communication devices, and a communication path coupling the host controller and the communication devices in a ring shape and configured to transmit a communication frame for serial communications, wherein the host controller and the communication devices each includes an ECC circuit configured to detect and correct an error and having a variable error correction capability, and the host controller is configured to set an error correction capability of the ECC circuit in accordance with an error caused in the communication path.

Embodiments will be described below with reference to the accompanying drawings. In the following descriptions, the components having substantially the same function and configuration are denoted by the same numeral or sign. The technical concept of each of the embodiments is exemplified. The embodiments do not limit the material, shape, configuration, location, or the like of the components. Various modifications can be made to the embodiments.

<1> First Embodiment

A communication system according to a first embodiment will be described.

<1-1> Configuration

<1-1-1> Configuration of Communication System

First, an example of a configuration of a communication system will be described with reference to FIG. 1. FIG. 1 is a block diagram showing the overall configuration of the communication system according to a first embodiment.

As shown in FIG. 1, a communication system 1 includes a system board 2, a connector 3, a host controller 4, a plurality of device boards 5 and a plurality of communication paths 8. In the example of FIG. 1, the communication system 1 includes n device boards 5-1 to 5-*n* and n communication paths 8-1 to 8-*n* corresponding to the n device boards 5-1 to 5-*n*, respectively, where n is an integer equal to or larger than 1.

The system board 2 is, for example, an accelerator board that is adapted to an ultra-wide band (e.g., 200 GB/s or higher) and a large capacity.

The connector 3 is provided on the system board 2. The connector 3 is used for wire connection between the system board 2 and an external device such as a computer. The connector 3 is coupled to the host controller 4. Note that the system board 2 may include, in addition to the connector 3, a communication circuit used for wireless connection between the system board 2 and the external device.

The host controller 4 controls the entire communication system 1. The host controller 4 controls each communication device 6 mounted on each of the device boards 5. If each the communication device 6 is, for example, a memory device, the host controller 4 requests (commands) the communication device 6 to write data, read data, or the like. That is, if each the communication device 6 is a memory device, the communication system 1 may also be referred to as a memory system. The host controller 4 transmits and receives information to and from the external device via the connector 3. The host controller 4 transmits and receives information to and from each of the device boards 5 via the communication paths 8. For example, the host controller 4 is configured to transmit and receive a differential serial signal.

Each device board 5 includes a substrate and a plurality of communication devices 6. In the example of FIG. 1, each device board 5 includes four communication devices 6-1 to 6-4. The communication devices 6-1 to 6-4 are implemented on the substrate by solder, sockets, or the like. For example, the communication devices 6-1 to 6-4 may be arranged side by side along the longitudinal direction of the substrate.

The communication devices 6 operate based on communications with the host controller 4. In the following descriptions, the communication devices 6 are memory devices each equipped with NAND flash memories. For example, the communication devices 6 may be memory systems such as solid-state drives (SSD) equipped with NAND flash memories. Note that if the communication devices 6 are memory devices, the device boards 5 may also be referred to as memory boards. The communication devices 6 are coupled communicatively to the host controller 4 via the communication paths 8.

The communication paths 8-1 to 8-*n* correspond to the device boards 5-1 to 5-*n*, respectively. Each communication path 8 connects the host controller 4 and the communication devices 6-1 to 6-4 included in the corresponding device board 5 in a ring shape coupling (hereinafter, also referred to as a ring coupling). More specifically, a data output terminal of the host controller 4, input and output terminals of the communication devices 6-1, 6-2, 6-3 and 6-4, and a data input terminal of the host controller 4 are coupled in a ring shape via the corresponding communication path 8. Each communication path 8 can transmit a differential serial signal. Also, each communication path 8 may have different characteristics at portions between the host controller 4 and the communication device 6-1, between the communication devices 6-1 and 6-2, between the communication devices 6-2 and 6-3, between the communication devices 6-3 and 6-4, and between the communication device 6-4 and the host controller 4. Specifically, each portion of the communication path 8 may have different bit error rates (BER) when the signal is transmitted through each portion of the communication path 8. Each portion can also be regarded as a part of the communication path 8. That is, each communication path 8 can be divided into portions between the host controller 4 and the communication device 6-1, between the communication devices 6-1 and 6-2, between the communication devices 6-2 and 6-3, between the communication devices 6-3 and 6-4, and between the communication device 6-4 and the host controller 4.

The communication devices 6 of one device board 5 transmit and receive a communication frame of differential serial signals via the corresponding communication path 8. The communication frame is a unit of data to be transmitted via the corresponding communication path 8. In the ring shape coupling, the communication frame output from the host controller 4 is returned to the host controller 4 via the communication devices 6-1, 6-2, 6-3 and 6-4. The communication frame includes a plurality of containers. A container length indicating the length (or size) of each of the containers is a fixed length. That is, a data length indicating the length (or size) of data (information) included in each of the containers is a fixed length. Each communication device 6 inserts (writes) and extracts (reads) data into and from the containers of a communication frame according to a particular condition. For example, the communication frame may include containers of the number corresponding to the bandwidth required for the communication system 1 and the bandwidth of each communication device 6.

Note that the communication system 1 may have a configuration excluding the system board 2. The system board 2 and the substrate of each of the device boards 5 may be formed integrally as one unit.

<1-1-2> Configuration of Host Controller

The configuration of the host controller 4 will be described with reference to FIG. 2. FIG. 2 is a block diagram of the host controller included in the communication system according to the first embodiment. As shown in FIG. 2, the host controller 4 includes a system on chip (SoC) 40 and a dynamic random access memory (DRAM) 401.

The SoC 40 is a device that implements a variety of functions of the host controller 4. The SoC 40 controls the DRAM 401. The SoC 40 includes a plurality of reception units (also referred to as Rx hereinafter) 41, a plurality of transmission units (also referred to as Tx hereinafter) 42, a plurality of protocol conversion units (also referred to as PCS hereinafter) 43, a plurality of error correction and detection circuits (also referred to as error correction codes or ECC hereinafter) 44, a plurality of communication control circuits (also referred to as CONT hereinafter) 45, an internal bus IB1, a central processing unit (CPU) 46, a DRAM controller 47, a peripheral component interconnect express (PCIe) controller 48 and a static random access memory (SRAM) 49. The SoC 40 is configured as a circuit device including these components.

Each configuration including the reception unit 41, transmission unit 42, protocol conversion unit 43, ECC circuit 44 and communication control circuit 45 functions as an interface circuit that controls data transmission and reception between the host controller 4 and each of the communication devices 6. That is, the SoC 40 includes a plurality of interface circuits corresponding to the communication paths 8. The communication control circuits 45, CPU 46, DRAM controller 47, PCIe controller 48 and SRAM 49 are coupled to each other by the internal bus IB1.

The reception units 41 are receiving circuits. The receiving units 41 each correspond to a physical layer. The reception units 41 are each coupled to its corresponding communication path 8 and its corresponding protocol converter 43, respectively. Each of the reception units 41 receives a communication frame from its preceding communication device 6 via the corresponding communication path 8. Each of the reception units 41 performs a physical process such as waveform equalization on the received communication frame and supplies it to the corresponding protocol conversion unit 43. The reception units 41 are adapted to communications at pulse amplitude modulation 4 (PAM-4) signal and pulse amplitude modulation 2 (PAM-2) signal.

The transmission units 42 are transmission circuits. The transmission units 42 each correspond to the physical layer. The transmission units 42 are each coupled to its corresponding communication path 8 and its corresponding protocol conversion unit 43. Each of the transmission units 42 performs a physical process such as waveform equalization on the communication frame supplied from the corresponding protocol conversion unit 43. Each of the transmission units 42 transmits the processed communication frame to its following communication device 6 via the corresponding communication path 8. The transmission units 42 are adapted to communications at the PAM-4 signal and PAM-2 signal.

The protocol conversion units 43 perform protocol conversion for the communication frames. The protocol conversion units 43 correspond to one of data link layers. The protocol conversion units 43 are each coupled to its corresponding ECC circuit 44. For example, each of the protocol conversion units 43 performs protocol conversion for the processed communication frame received from the corresponding reception unit 41 in accordance with the protocol of the upper layer. In other words, each of the protocol conversion units 43 performs protocol conversion for the processed communication frame received from the corresponding reception unit 41 in accordance with a bus protocol of the internal bus IB1. The upper layer is a layer that is higher than the data link layers when the structure of a communication layer in communications between the host controller 4 and each of the communication devices 6 is roughly divided. For example, the internal bus IB1 and the circuits (CPU 46, DRAM controller 47, PCIe controller 48, SRAM 49 and DRAM 401) coupled to the communication control circuits 45 via the internal bus IB1 correspond to the upper layer. Each of the protocol conversion units 43 transmits to its corresponding ECC circuit 44 a communication frame that is obtained by protocol conversion in accordance with the upper layer.

In addition, each of the protocol conversion units 43 performs protocol conversion for the communication frame received from the corresponding ECC circuit 44 in accordance with the protocol of the lower layer. In other words, each of the protocol conversion units 43 performs protocol conversion for the communication frame received from the corresponding ECC circuit 44 in accordance with a protocol corresponding to the communication path 8. The lower layer is a layer that is lower than the physical layer when the structure of the communication layer is roughly divided. Each of the protocol conversion units 43 transmits to the corresponding transmission unit 42 a communication frame obtained by protocol conversion in accordance with the lower layer.

The ECC circuits 44 correct and detect errors of data included in the communication frames. The data error correction performed by the ECC circuits 44 is referred to as an ECC process. The ECC circuits 44 also perform cyclic redundancy check (CRC). The error detection performed by the ECC circuits 44 is referred to as a CRC process. The ECC circuits 44 correspond to one of the data link layers. Each of the ECC circuits 44 receives a communication frame from the corresponding protocol conversion unit 43. Each of the ECC circuits 44 performs an ECC process on the received communication frame and further performs a CRC process to check whether or not all errors have been corrected. Then, each of the ECC circuits 44 transmits the communication frame to the corresponding communication control circuit 45. Note that if it is found by the CRC process that an error remains in the communication frame, each of the ECC circuits 44 instructs the corresponding communication control circuit 45 to retransmit the communication frame. The retransmission is a process of causing a transmission source to transmit a target communication frame again. The ECC circuits 44 add data for use in the ECC process and CRC process to the data received from the communication control circuits 45, and transmit the data to the protocol conversion units 43. Note that the ECC circuits 44 can change the correction capability of the ECC process, specifically, the data size that can be corrected by the ECC process. In the present specification, as examples of the correction capability of the ECC circuits 44, a 1-byte correction capability and a 3-byte correction capability are used.

Each of the communication control circuits 45 inserts and extracts data into and from a container corresponding to its own device in a communication frame. The communication control circuits 45 correspond to one of the data link layers. For example, each of the communication control circuits 45 extracts data (information) from a container corresponding to its own device in a communication frame received from the corresponding ECC circuit 44. Each of the communication control circuits 45 inserts data (information) of a packet from the upper layer into an empty container of the communication frame. The packet is a transmission unit of data transmitted and received between the communication control circuits 45 and the upper layer to correspond to an operation (write operation, read operation, etc.) performed in the upper layer. The upper layer includes a plurality of devices coupled via the internal bus IB1.

The CPU 46 is a processor. The CPU 46 controls the operation of the entire host controller 4 in response to a request from an external device coupled to the connector 3. The CPU 46 controls the DRAM controller 47, PCIe controller 48 and SRAM 49 via the internal bus IB1.

The DRAM controller 47 controls the DRAM 401 in response to a request from the CPU 46. The DRAM controller 47 transmits and receives data to and from the DRAM 401 via a signal line IOa.

The DRAM 401 is a volatile memory. Note that the DRAM 401 may be another volatile memory or a nonvolatile memory. The DRAM 401 temporarily stores data read by the SoC 40 from the communication devices 6, data received from an external device coupled to the connector 3, and the like. Note that the DRAM 401 may be implemented at the interior of the SoC 40.

The PCIe controller 48 controls communication with an external device via the connector 3. The PCIe controller 48 transmits and receives data to and from an external device via a signal line IOb and the connector 3. For example, the PCIe controller 48 transmits data read from the communication devices 6 to an external device coupled to the connector 3. The PCIe controller 48 also receives data to be written to the communication devices 6 from the external device coupled to the connector 3.

The SRAM 49 is a volatile memory. Note that the SRAM 49 may be another memory whose access speed is higher than that of the DRAM 401. The SRAM 49 may be used as a work area for the CPU 46.

<1-1-3> Configuration of Communications Device

The configuration of one of the communication devices 6 will be described below with reference to FIG. 3. FIG. 3 is a block diagram of a communication device included in the communication system according to the first embodiment. As shown in FIG. 3, each of the communication devices 6 includes an SoC 60, a DRAM 601 and a plurality of NAND flash memories 602. Hereinafter, the NAND flash memories 602 will also be referred to as NAND memories 602.

The SoC 60 is a device that operates in response to a request from the host controller 4. The SoC 60 controls the DRAM 601 and the NAND memories 602. For example, the SoC 60 instructs the NAND memories 602 to perform a read operation, a write operation, and the like. The SoC 60 includes a reception unit (also referred to as Rx hereinafter) 61, a transmission unit (also referred to as Tx hereinafter) 62, a protocol conversion unit (also referred to as PCS hereinafter) 63, an ECC circuit (also referred to as ECC hereinafter) 64, a communication control circuit (also referred to as CONT hereinafter) 65, an internal bus IB2, a CPU 66, a DRAM controller 67, a NAND controller 68, and an SRAM 69. The SoC 60 is configured as a circuit device including these components.

The configuration including the reception unit 61, transmission unit 62, protocol conversion unit 63, ECC circuit 64 and communication control circuit 65 functions as an interface circuit that controls transmission and reception of data between the host controller 4 and the communication device 6 where the configuration is included. The communication control circuit 65, CPU 66, DRAM controller 67, NAND controller 68 and SRAM 69 are coupled to each other by the internal bus IB2.

The reception unit 61 is a reception circuit. The reception unit 61 corresponds to the physical layer. The reception unit 61 is coupled to the corresponding communication path 8 and the protocol conversion unit 63. The reception unit 61 receives a communication frame from the host controller 4 or the preceding communication device 6 via the corresponding communication path 8. The reception unit 61 performs a physical process such as waveform equalization on the received communication frame and supplies it to the protocol conversion unit 63. In addition, the reception unit 61 is adapted to communications at the PAM-4 signal and the PAM-2 signal.

The transmission unit 62 is a transmission circuit. The transmission unit 62 corresponds to the physical layer. The transmission unit 62 is coupled to the corresponding communication path 8 and the protocol conversion unit 63. The transmission unit 62 performs a physical process such as waveform equalization on the communication frame supplied from the protocol conversion unit 63. The transmission unit 62 transmits the processed communication frame to the host controller 4 or the following communication device 6 via the corresponding communication path 8. In addition, the transmission unit 62 is adapted to communications at the PAM-4 signal and the PAM-2 signal.

The protocol conversion unit 63 performs protocol conversion for a communication frame. The protocol conversion unit 63 corresponds to one of the data link layers. The protocol conversion unit 63 is coupled to the ECC circuit 64. For example, the protocol conversion unit 63 performs protocol conversion for the processed communication frame, which is received from the reception unit 61, in accordance with the protocol of the upper layer. In other words, the protocol conversion unit 63 performs protocol conversion for the processed communication frame, which is received from the reception unit 61, in accordance with the bus protocol of the internal bus IB2. The upper layer is a layer that is higher than the data link layers when the structure of the communication layer in the communication between the host controller 4 and the communication devices 6 is roughly divided. For example, the internal bus IB2 and the circuits (CPU 66, DRAM controller 67, NAND controller 68, SRAM 69, DRAM 601 and NAND memories 602) coupled to the communication control circuit 65 via the internal bus IB2 correspond to the upper layer. The protocol conversion unit 63 transmits to the ECC circuit 64 a communication frame obtained by protocol conversion in accordance with the upper layer.

The protocol conversion unit 63 also performs protocol conversion for the communication frame, which is received from the ECC circuit 64, in accordance with the protocol of the lower layer. In other words, the protocol conversion unit 63 performs protocol conversion for the communication frame received, which is from the ECC circuit 64, in accordance with a protocol corresponding to the corresponding communication path 8. The lower layer is a layer that is lower than the physical layer when the structure of the communication layer is roughly divided. The protocol conversion unit 63 transmits to the transmission unit 62 a communication frame obtained by protocol conversion in accordance with the lower layer.

The ECC circuit 64 corrects and detects errors of data included in a communication frame. The data error correction performed by the ECC circuit 64 is referred to as an ECC process as in the case of the ECC circuits 44. The ECC circuit 64 performs CRC. The error detection performed by the ECC circuit 64 is referred to as a CRC process as in the case of the ECC circuits 44. The ECC circuit 64 corresponds to one of the data link layers. The ECC circuit 64 receives a communication frame from the protocol conversion unit 63. The ECC circuit 64 performs the ECC process on the received communication frame and further performs the CRC process to check whether or not all errors have been corrected. Then, the ECC circuit 64 transmits the communication frame to the communication control circuit 65. Note that if it is found by the CRC process that an error remains in the communication frame, the ECC circuit 64 instructs the communication control circuit 65 to retransmit the communication frame. The ECC circuit 64 adds data for use in the ECC process and CRC process to the data received from the communication control circuit 65, and transmits the data to the protocol conversion unit 63. Note that the ECC circuit 64 can change the correction capability of the ECC process, specifically, the data size that can be corrected by the ECC process. In the present specification, as examples of the correction capability of the ECC circuit 64, a 1-byte correction capability and a 3-byte correction capability are used.

The communication control circuit 65 inserts and extracts data into and from a container corresponding to its own device in the communication frame. The communication control circuit 65 corresponds to one of the data link layers. For example, the communication control circuit 65 extracts data (information) from a container corresponding to its own device in a communication frame received from the ECC circuit 64. The communication control circuit 65 inserts data (information) of a packet from the upper layer into an empty container of the communication frame. The upper layer includes a plurality of devices coupled via the internal bus IB2.

The CPU 66 is a processor. The CPU 66 controls the operation of the entire communication device 6 which it is included in response to a request from the host controller 4. The CPU 66 controls the DRAM controller 67, NAND controller 68, and SRAM 69 via the internal bus IB2. For example, the CPU 66 instructs the NAND controller 68 to write and read data to and from the NAND memories 602.

The DRAM controller 67 controls the DRAM 601 in response to a request from the CPU 66. The DRAM controller 67 transmits and receives data to and from the DRAM 601 via a signal line IOc.

The DRAM 601 is a volatile memory. Note that the DRAM 601 may be another volatile memory or a nonvolatile memory. The DRAM 601 temporarily stores data read from one of the NAND memories 602 by the SoC 60, data received from the host controller 4, and the like. Note that the DRAM 601 may be implemented at the interior of the SoC 60.

The NAND controller 68 can control the NAND memories 602. The single NAND controller 68 may control a plurality of the NAND memories 602. The NAND controller 68 transmits and receives data to and from the NAND memories 602 via signal lines IOd. For example, the NAND controller 68 transmits to one of the NAND memories 602 data (command, address, data, etc.) corresponding to a write operation, a read operation or an erase operation. In addition, the NAND controller 68 receives read data from one of the NAND memories 602 during read operation.

Each of the NAND memories 602 is a nonvolatile storage medium. Note that each of the NAND memories 602 may be a nonvolatile storage medium other than a NAND flash memory. The NAND memories 602 nonvolatilely store the data received from the NAND controller 68. The NAND memories 602 read the nonvolatilely stored data and transmit it to the NAND controller 68.

The SRAM 69 is a volatile memory. Note that the SRAM 69 may be another memory whose access speed is higher than that of the DRAM 401. The SRAM 69 may be used as a work area for the CPU 66.

<1-1-3> Configuration of Communication Frame

An example of the configuration of a communication frame will be described below with reference to FIG. 4. FIG. 4 is a diagram showing an example of a communication frame treated in the communication system according to the first embodiment. Note that in the following descriptions, identification information items of the host controller 4, communication device 6-1, communication device 6-2, communication device 6-3 and communication device 6-4 will be referred to as ID0, ID1, ID2, ID3 and ID4, respectively.

As shown in FIG. 4, a plurality of communication frames FR are transmitted in sequence from the host controller 4. For example, each of the communication frames FR includes a plurality of containers CT of the same fixed length. In the example of FIG. 4, the communication frame FR-1 includes four containers CT (CT1 to CT4) of the same fixed length. Each of the containers CT stores data (information) that can be inserted and extracted by the host controller 4 and the communication devices 6. The communication frame FR-2 and its subsequent frames have the same configuration.

Each of the containers CT may store data corresponding to the host controller 4 or one of the communication devices 6. In the example of FIG. 4, the container CT1 stores identification information item ID1, that is, data corresponding to the communication device 6-1. The container CT2 stores identification information item ID2, that is, data corresponding to the communication device 6-2. The container CT3 stores identification information item ID3, that is, data corresponding to the communication device 6-3. The container CT4 stores identification information item ID4, that is, data corresponding to the communication device 6-4. Note that data stored in each of the containers CT is optional. For example, the container CT1 may store identification information item ID0, that is, data corresponding to the host controller 4 or may store data corresponding to one of the identification information items ID2 to ID4. Furthermore, the containers CT2 to CT4 may store data corresponding to the identification information item ID1.

The containers CT each include a container header CH and a container payload CP. The container header CH includes a container payload (CP) identifier and transmission destination information. Note that the container header CH may include transmission source information. The CP identifier is an identifier that identifies the start of the container payload CP and the end thereof when the containers CT are collectively transferred. The transmission destination information includes identification information ID of one of the communication devices 6 or the host controller 4, which is a transmission destination. For example, if the transmission destination is the communication device 6-1, the transmission destination information includes information indicating the identification information ID1.

The container payload CP includes data transmitted/received (transferred) between a lower layer and an upper layer. The data length of data included in the container payload CP is fixed. The container payload CP includes a packet header PH, a packet payload PP, and ECC data ED.

The packet header PH includes a packet payload (PP) identifier. The PP identifier is an identifier that identifies the start of the packet payload PP and the end thereof when a plurality of packet payloads PP are collectively transferred.

The packet payload PP includes data (information) corresponding to an operation performed in the upper layer. In other words, the packet payload PP includes data of the packet PK of the upper layer. For example, the packet payload PP may include information (address) indicating a transmission destination, attribute information (command) of an operation (read operation, write operation, etc.) performed in the upper layer, data (write data, read data, etc.), and the like. If, for example, data is written to the NAND memories 602, the packet payload PP transmitted from the lower layer to the upper layer includes a write command, an address and write data. If, for example, data is read from the NAND memories 602, the packet payload PP transmitted from the upper layer to the lower layer includes read data.

The ECC data ED is data used by the ECC circuits 44 and 64 on the receiving side to correct and detect errors of the packet header PH and the packet payload PP. The ECC data ED is data which is generated based on the packet header PH and the packet payload PP by the ECC circuits 44 and 64 on the transmitting side in order to correct and detect errors to be used by the ECC circuits 44 and 64 on the receiving side.

<1-2> Operation

The operation of the communication system 1 according to the first embodiment will be described.

<1-2-1> Overview of Operation of Communication System

FIG. 5 is a flowchart showing the operation of the communication system according to the first embodiment. When the communication system 1 is powered on (Start), it performs an initialization operation (S1). After the initialization operation is completed, the communication system 1 performs a normal operation (S2). After the normal operation is completed, the communication system 1 terminates the operation (End).

As described above, the communication system 1 according to the first embodiment performs the initialization operation and the normal operation. First, an example of transmission of a communication frame FR in the ring coupling will be described as an example of the normal operation. Then, the initialization operation will be described in detail.

<1-2-2> Example of Transmission of Communication Frame in Ring Coupling

An example of transmission of the communication frame FR in the ring coupling will be described with reference to FIG. 6. FIG. 6 is a diagram showing an example of transmission of a communication frame in the ring coupling of the communication system according to the first embodiment. FIG. 6 shows the host controller 4 and one of the device boards 5 coupled to the host controller 4. For brevity of description, in the example of FIG. 6, the NAND controller 68 coupled to the internal bus IB2 in each communication device 6 (6-1 to 6-4) is shown, and other circuits and configurations are omitted.

As shown in FIG. 6, for example, the host controller 4 transmits to the communication device 6-1 a communication frame FR including containers CT1, CT2, CT3 and CT4. In this communication frame FR, the container CT1 stores the identification information ID1 (corresponding to communication device 6-1), the container CT2 stores the identification information ID2 (corresponding to communication device 6-2), the container CT3 stores the identification information ID3 (corresponding to communication device 6-3), and the container CT4 stores the identification information ID4 (corresponding to communication device 6-4). Note that the container payload CP in each container CT includes the packet header PH, the packet payload PP and the ECC data ED. The ECC data ED is each generated by the ECC circuits 44 of the host controller 4 based on the corresponding packet header PH and packet payload PP.

Upon receiving a communication frame FR, the communication device 6-1 performs the ECC process and the CRC process. Specifically, in the communication device 6-1, the ECC circuit 64 corrects and detects errors of the packet header PH and the packet payload PP based on the ECC data ED included in each container CT. Then, the ECC circuit 64 checks whether or not all of the errors have been corrected by the CRC process. Then, in the communication device 6-1, data is extracted from the container CT1. More specifically, the communication control circuit 65 of the communication device 6-1 performs the following operation. The communication control circuit 65 confirms transmission destination information of the container header CH of each container CT. If the communication control circuit 65 confirms that the container header CH of the container CT1 includes identification information ID1 of its own device as the transmission destination information, it extracts data from the packet payload PP of the container payload CP of the container CT1. The communication control circuit 65 transmits the extracted data to the upper layer as a packet PK. If the extracted data (packet PK) includes, for example, a command requesting a write operation, an address, and write data, the CPU 66 controls the NAND controller 68 to perform an operation of writing data to the NAND memories 602.

If, for example, in the communication device 6-1, there is data (data of packet PK) to be transmitted to the host controller 4, which can be inserted into the container CT1, the communication control circuit 65 converts the transmission destination information of the container header CH of the container CT1 from the identification information ID1 which is corresponding to its own device into the identification information ID0 which is corresponding to the host controller 4. Then, the communication control circuit 65 inserts data to be transmitted to the host controller 4 into the packet payload PP of the container payload CP of the container CT1 to update the communication frame FR. If, for example, the data to be transmitted is read data corresponding to a command requesting a read operation included in the received communication frame FR, the communication control circuit 65 inserts the data read from the NAND memories 602 into the container payload CP of the container CT1. That is, the data corresponding to the identification information ID0 is inserted into the container CT1. Note that if there is no data (packet PK) to be inserted into the container CT1, the communication control circuit 65 erases the data of the container header CH and container payload CP of the container CT1 into an empty (Null) state to update the communication frame FR. After that, the ECC circuit 64 creates and updates the ECC data ED of each container CT based on the packet header PH and the packet payload PP included in each container CT. Then, the communication device 6-1 transmits the updated communication frame FR to the communication device 6-2.

As in the communication device 6-1, in the communication device 6-2, an ECC process and a CRC process are performed, and data is inserted into and extracted from the container CT2. As a result, data corresponding to the identification information ID2 is extracted from the container CT2. Then, for example, data corresponding to the identification information ID0 is inserted into the container CT2. In addition, the ECC data ED of each container CT is updated. Then, the communication device 6-2 transmits the updated communication frame FR to the communication device 6-3.

As in the communication device 6-1, in the communication device 6-3, an ECC process and a CRC process are performed, and data is inserted into and extracted from the container CT3. As a result, data corresponding to the identification information ID3 is extracted from the container CT3. Then, for example, data corresponding to the identification information ID0 is inserted into the container CT3. In addition, the ECC data ED of each container CT is updated. Then, the communication device 6-3 transmits the updated communication frame FR to the communication device 6-4.

As in the communication device 6-1, in the communication device 6-4, an ECC process and a CRC process are performed, and data is inserted into and extracted from the container CT4. As a result, data corresponding to the identification information ID4 is extracted from the container CT4. Then, for example, data corresponding to the identification information ID0 is inserted into the container CT4. In addition, the ECC data ED of each container CT is updated. Then, the communication device 6-4 transmits the updated communication frame FR to the host controller 4.

<1-2-3> Example of Initialization Operation of Communication System

An initialization operation will be described in detail below with reference to FIG. 7. FIG. 7 is a flowchart showing an initialization operation of the communication system according to the first embodiment.

When the initialization operation is started (Start), the host controller 4 instructs each of the communication devices 6 to output a training pattern, and outputs the training pattern (S11). The training pattern is the same pattern and known to the host controller 4 and the communication devices 6.

Then, the host controller 4 and each of the communication devices 6 measure the BER of the received training pattern to examine a necessary ECC capability (S12). Specifically, the host controller 4 and each of the communication devices 6 compare the known training pattern with the reception result of the training pattern transmitted from the previous stage to measure the BER. Based on the BER, an ECC capability necessary for data correction is determined. The ECC capability is, for example, a data size (e.g., the number of bytes) that can be corrected by the ECC process.

Then, the host controller 4 instructs each communication device 6 and the host controller 4 itself to change a method of communication between the host controller 4 and the communication device 6 and a method of communication between the communication device 6 and another communication device 6 to a low-error communication method (S13). More specifically, for example, a normal communication method at the PAM-4 signal is changed to a low-error communication method at the PAM-2 signal.

Then, the host controller 4 instructs each communication device 6 to transmit the examination result of the ECC capability (S14). Specifically, the host controller 4 instructs each communication device 6 to transmit the examination result of the ECC capability examined in S12.

Then, the host controller 4 receives the examination results from each communication device 6 (S15).

Then, the host controller 4 determines the ECC capability based on the received examination results (S16). A method for determining the ECC capability will be described in detail later.

Then, the host controller 4 sets the determined ECC capability to each of the communication devices 6 and the host controller 4 itself (S17).

Then, the host controller 4 instructs each communication device 6 and the host controller 4 itself to change a method of communication between the host controller 4 and the communication device 6 and a method of communication between the communication device 6 and another communication device 6 to the normal communication method (S18). Specifically, for example, the low-error communication method at the PAM-2 signal is changed to the normal communication method at the PAM-4 signal.

Then, the host controller 4 terminates the initialization operation (End).

The method of determining the ECC capability shown in S16 of FIG. 7 will be described in more detail.

In the communication system 1 according to the first embodiment, the ECC capability, which is adaptable to the most error-prone one of the portions of the communication path 8 constituting one ring coupling, is used in common with the entire communication path. Specifically, the highest error-correction capability among the ECC capabilities that are examined in S12 of FIG. 7 is applied to the entire communication path constituting the one ring coupling. Assume that the one ring coupling is configured by, for example, two different portions: a portion to which the ECC correction capability can be adapted by 1 byte and a portion to which the ECC correction capability can be adapted by 3 bytes. In this case, the communication system 1 according to the first embodiment employs 3 bytes as the ECC correction capability for the entire one ring coupling.

<1-3> Advantageous Effects

The communication system 1 according to the first embodiment described above makes it possible to prevent a data transfer capability from decreasing. The advantageous effects of the communication system 1 according to the first embodiment will be described in detail below.

In communication systems having the ring coupling, an ECC circuit corrects and detects errors to prevent data from being retransmitted and thus maintains the performance of the communication systems. If the correction capability of the ECC circuit is insufficient relative to the number of errors, data needs to be retransmitted to decrease the performance of the communication systems. Since power consumption and latency may increase if the correction capability of the ECC circuit increases, it is not preferable to increase the correction capability more than necessary. It is desirable to set the correction capability of the ECC circuit appropriately to correspond to the number of errors caused in a communication path.

The communication system 1 according to the first embodiment outputs a training pattern and examines how much correction capability is necessary in the initial setting operation. Based on the results of the examination, the communication system 1 determines the correction capability of the ECC circuit and applies it to the entire ring coupling. Therefore, the communication system 1 according to the first embodiment can set the correction capability of the ECC circuit appropriately to correspond to the number of errors caused in the communication path.

<2> Second Embodiment

A communication system 1a according to a second embodiment differs from the communication system 1 according to the first embodiment in a specific configuration of the container payload CP and an operation of determining the ECC capability. Below is a description of points of the communication system 1a of the second embodiment different from those of the first embodiment.

<2-1> Configuration

<2-1-1> Configuration of Container Payload

FIG. 8 is a diagram showing an example of a configuration of the container payload CP of the communication system according to the second embodiment. As shown in FIG. 8, the container payload CP includes a packet header PH, a packet payload PP and ECC data ED. The packet header PH and the packet payload PP each have a fixed length of 245 bytes, and the ECC data ED has a fixed length of 10 bytes. The ECC data ED may include valid data END and invalid data DAD. If the error correction capability of the ECC circuits 44 and 64 is set to 1 byte, 6 bytes of the 10 bytes of the ECC data ED are valid data END, and 4 bytes thereof are invalid data DAD. The invalid data DAD is null data. If the error correction capability of the ECC circuits 44 and 64 is set to 3 bytes, the 10-byte ECC data ED does not include invalid data DAD, and 10 bytes of the ECC data ED are all valid data END.

Thus, the size of the valid data END varies depending on the strength of the error correction capability. However, in the communication system 1a according to the second embodiment, the length of the ECC data ED is fixed. If the amount of valid data END is small, invalid data DAD is added thereto until the size becomes the same as when the amount of valid data END is large. Therefore, in the communication system 1a according to the second embodiment, the ECC data ED is maintained at a fixed size regardless of the strength of the error correction capability.

<2-2> Operation

A method of determining an ECC capability in the second embodiment which corresponds to that shown in S16 of FIG. 7 will be described in detail.

The communication system 1a according to the second embodiment sets an appropriate ECC capability to each of the portions of a communication path constituting a ring coupling. Specifically, the ECC capability examined in S12 of FIG. 7 is applied to each of the portions of the communication path. Assume that, for example, one ring coupling includes a portion to which the ECC correction capability can be adapted by 1 byte and a portion to which the ECC correction capability can be adapted by 3 bytes. In this case, for the communication system 1a according to the second embodiment, a 1-byte correctable ECC capability is applied to the former and a 3-byte correctable ECC capability is applied to the latter.

<2-3> Advantageous Effects

In the communication system 1a according to the second embodiment, an ECC capability is set to each portion of the communication path 8 in accordance with the characteristics of the portion. The variations in the size of the valid data END, which depend on the strength of the ECC capability, are matched to the case where the size of the valid data END is maximized by the addition of invalid data DAD. Thus, the size of the container payload CP can be fixed, and the time required for communication can be made to be uniform regardless of the strength of the ECC capability.

Furthermore, in the communication system 1a according to the second embodiment, a correction capability can be set in accordance with the characteristics of each portion of the transmission path. Thus, an increase in power consumption and in latency due to an excessive error correction capability can be suppressed.

<3> Third Embodiment

<3-1> Configuration

A communication system 1b according to a third embodiment differs from the communication system 1a according to the second embodiment in a specific configuration of the container payload CP and a communication method thereof. Below is a description of points of the communication system 1b according to the third embodiment different from the communication system 1a according to the second embodiment.

FIG. 9 is a diagram showing a configuration example of the container payload CP of the communication system according to the third embodiment. As shown in FIG. 9, the container payload CP includes a fixed-length packet header PH and a packet payload PP and variable-length ECC data ED. The container payload CP includes, for example, a 245-byte (fixed-length) packet header PH and a packet payload PP and 6-byte or 10-byte (variable-length) ECC data ED. If the error correction capability of the ECC circuits 44 and 64 is 1 byte, a total of 251 bytes of 245 bytes of the packet header PH and the packet payload PP and 6 bytes of the ECC data ED corresponds to the bytes of the container payload CP. In this case, the 6-byte ECC data ED includes 6-byte valid data END. If the error correction capability of the ECC circuits 44 and 64 is 3 bytes, a total of 255 bytes of 245 bytes of the packet header PH and the packet payload PP and 10 bytes of the ECC data ED corresponds to the bytes of the container payload CP. In this case, the 10-byte ECC data ED includes 10-byte valid data END.

<3-2> Operation

The communication system 1b according to the third embodiment varies the speed of communication performed via each of the communication paths 8 according to the error correction capability set in each of the ECC circuits 44 or 64. Specifically, if the error correction capability of one of the ECC circuits 44 or 64 is 1 byte, communication is performed at a reference normal speed. If the error correction capability of one of the ECC circuits 44 or 64 is 3 bytes, communication is performed at a higher speed than normal, for example, at a 1.6% higher speed. The 1.6% is derived from the fact that 255 bytes of the container payload CP are approximately 1.6% larger than 251 bytes thereof. If communication is performed at a 1.6% higher speed than normal when the error correction capability of one of the ECC circuits 44 or 64 is 3 bytes, it can be done in approximately the same time as when communication is performed at a normal speed when the error correction capability of one of the ECC circuits 44 or 64 is 1 byte.

<3-3> Advantageous Effects

In the illustrated case, there is a 4-byte difference between the bytes of the container payload CP in the case where the error correction capability of one of the ECC circuits 44 or 64 is 1 byte and those in the case where the error correction capability thereof is 3 bytes. However, the communication system 1b according to the third embodiment performs communication at a high speed when the error correction capability of one of the ECC circuits 44 or 64 is 3 bytes. Thus, the time required for data transfer in the case where the error correction capability of one of the ECC circuits 44 or 64 is 1 byte can be made equal to the time required for data transfer in the case where the error correction capability thereof is 3 bytes.

Furthermore, in the communication system 1b according to the third embodiment, a correction capability can be set in accordance with the characteristics of each portion of the communication path 8. Thus, an increase in power consumption and in latency due to an excessive error correction capability can be suppressed.

(4) Fourth Embodiment

A communication system 1c according to a fourth embodiment differs from the communication system 1 according to the first embodiment in that the ECC capability is changed except for the initialization operation. Below is a description of points of the communication system 1c according to the fourth embodiment different from the communication system 1 of the first embodiment.

<4-1> Operation

A normal operation of the communication system 1c as shown in S2 of FIG. 5 will be described. In the normal operation, the host controller 4 and each communication device 6 communicate with each other. If, in the ECC circuit 64 of the communication device 6, the correction frequency in the ECC process or the retransmission frequency in the CRC process exceeds a threshold value, the communication device 6 notifies the host controller 4 that the correction or retransmission frequency is high. The ECC circuits 44 of the host controller 4 monitor whether or not the correction frequency in the ECC process or the retransmission frequency in the CRC process exceed a threshold value. Note that the correction frequency is the total number of errors corrected by the ECC process per particular time. The retransmission frequency is the total number of retransmissions generated by the CRC process per particular time. Under such a situation, a resetting operation is performed.

FIG. 10 is a flowchart showing a resetting operation of the communication system according to the fourth embodiment.

When the resetting operation is started (Start), the host controller 4 determines whether or not a notification indicating that the frequency of correction or retransmission is high is received or detected (S21).

If the notification is received or detected (Yes in S21), the host controller 4 determines a new ECC capability based on the received or detected notification (S22). Details of a method of determining an ECC capability will be described later.

Then, the host controller 4 sets the determined ECC capability to each communication device 6 and itself (the host controller 4) (S23).

Then, the host controller 4 terminates the resetting operation (End).

If the host controller 4 does not receive or detect the notification indicating that the frequency of the correction or retransmission is high (No in S21), the resetting operation is terminated (End).

Below is a more detailed description of the method of determining the ECC capability shown in S22 of FIG. 10.

If errors increase in a certain portion of one of the communication paths 8, a higher ECC capability required in that portion is determined as a new ECC capability applied to the entire ring coupling by the communication system 1c according to the fourth embodiment. Specifically, assume that for example, the entire ring coupling is operated with a 1-byte correctable ECC capability, and errors increase in a certain portion of the communication path 8. In this case, the communication system 1c according to the fourth embodiment determines a 3-byte correctable ECC capability as a new ECC capability for the entire ring coupling.

<4-2> Advantageous Effects

Errors caused in one of the communication paths 8 may increase with environmental changes such as temperature changes. The communication system 1c according to the fourth embodiment resets the ECC capability when errors increase in one of the communication paths 8. Thus, the communication system 1c according to the fourth embodiment can set the correction capability of the ECC circuits 44 and 64 to an appropriate correction capability adapted to environmental changes.

<5> Fifth Embodiment

A communication system 1d according to a fifth embodiment differs from the communication system 1c according to the fourth embodiment in the method of determining the ECC capability. Below is a description of points of the communication system 1d of the fifth embodiment different from the communication system 1c of the fourth embodiment.

<5-1> Operation

A method of determining an ECC capability in the fifth embodiment which corresponds to the ECC capability determining method shown in S22 of FIG. 10 will be described in detail.

The communication system 1d according to the fifth embodiment sets an appropriate ECC capability to each portion of one of the communication paths 8 constituting a ring coupling. Accordingly, the ECC capability is reset for each portion of the communication path 8. Assume that the characteristics of a certain portion of the communication path 8 deteriorate and an error increases in 1-byte correction for which the ECC capability was initially sufficient. In this case, the communication system 1d of the fifth embodiment changes the ECC capability for use in the communication related to the certain portion to, for example, an ECC capability for 3-byte correction, and does not change the ECC capability to the ECC capability for the other portions.

To use different ECC capabilities for the portions of one of the communication paths 8, a method using invalid data DAD as described in the second embodiment or a method of increasing the communication speed as described in the third embodiment can be applied.

<5-2> Advantageous Effects

If the characteristics of a certain portion of one of the communication paths 8 are changed, the communication system 1d according to the fifth embodiment can change the ECC capability of the ECC process for use in the communication related to an ECC capability for the certain portion and does not change the ECC capability to the ECC capability for the other portions of the communication path 8. Thus, the communication system 1d according to the fifth embodiment can be adapted to environmental changes.

In addition, the communication system 1d according to the fifth embodiment can set a correction capability corresponding to the characteristics of each portion of the trans-mission path. Thus, an increase in power consumption and an increase in latency due to an excessive error correction capability can be suppressed.

<6> Modification, Etc.

In the first embodiment, the PAM-4 signal is changed to the PAM-2 signal as an example of a low-error communication method. The low-error communication method is not limited to this. For example, a method of communicating the same data a plurality of times or a method of communicating data via an interface circuit without using the communication path 8 can be applied. These methods will be described below.

In the former communication method, error tolerance is improved by transmitting and receiving the same data a plurality of times during data communication. Since the same data is transmitted a plurality of times, even if an error occurs in each piece of data, correct data can be obtained by comparing the data received a plurality of times.

In the latter communication method, the communication path 8 is not used, but such as an interface circuit of I2C and another interface circuit of a communication path other than the communication path 8 are used for communication. It is necessary to connect the host controller 4 and each of the communication devices 6 and connect the communication devices 6 in advance by the interface circuit of I2C and another interface circuit. Correct data can be obtained by using an interface circuit and a communication path where errors are not problematic (where errors are unlikely to occur).

In the foregoing embodiment, the communication devices 6 are memory devices including a NAND flash memory, but the communication devices 6 are not limited to memory devices. A plurality of communication devices 6 mounted on one device board 5 may be different from one another.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication system comprising:

a host controller;

a plurality of communication devices; and a communication path coupling the host controller and the communication devices in a ring shape and configured to transmit a communication frame for serial communications, wherein:

the host controller includes a first error correction and detection circuit configured to detect and correct an error and having a variable error correction capability;

the communication devices each include a second error correction and detection circuit configured to detect and correct an error and having a variable error correction capability; and the host controller is configured to output a training pattern, cause the communication devices to output the training pattern, examine errors caused in the communication path based on the training pattern, and set an error correction capability of each of the first error correction and detection circuit and the second error correction and detection circuits in accordance with the errors caused in the communication path.

2. The communication system of claim 1, wherein if a first number of errors are caused in a first portion of the communication path and a second number of errors are caused in a second portion of the communication path, the second number being larger than the first number, the host controller is further configured to apply an error correction capability adaptable to the second number of errors to the first portion and the second portion.

3. The communication system of claim 1, wherein if a first number of errors are caused in a first portion of the communication path and a second number of errors are caused in a second portion of the communication path, the second number being larger than the first number, the host controller is further configured to apply a first error correction capability adaptable to the first number of errors to the first portion and to apply a second error correction capability adaptable to the second number of errors to the second portion.

4. The communication system of claim 3, wherein a size of first data to which the first error correction capability is applied is equal to a size of second data to which the second error correction capability is applied.

5. The communication system of claim 3, wherein:
first data to which the first error correction capability is applied has a first size and is communicated at a first speed; and
second data to which the second error correction capability is applied has a second size that is larger than the first size and is communicated at a second speed that is higher than the first speed.

6. The communication system of claim 1, wherein the host controller is further configured to use a first communication method to output the training pattern and to communicate with the communication devices by a second communication method other than the first communication method.

7. The communication system of claim 6, wherein the first communication method is communication using a PAM-4 signal and the second communication method is communication using a PAM-2 signal.

8. The communication system of claim 6, wherein the second communication method includes a process of repeatedly transmitting the same data.

9. The communication system of claim 6, wherein the second communication method uses a sub-communication path which differs from the communication path and connects the host controller and the communication devices.

10. The communication system of claim 1, wherein if an error correction frequency or a retransmission frequency of the communication frame in one of the first error correction and detection circuit and the second error correction and detection circuits in a first portion of the communication path exceeds a reference value, the host controller is further configured to change the error correction capability for the first portion of the communication path and a second portion different from the first portion thereof in a different operation from the setting the error correction capability in accordance with the errors caused in the communication path and examined by using the training pattern.

11. The communication system of claim 1, wherein if an error correction frequency or a retransmission frequency of the communication frame in one of the first error correction and detection circuit and the second error correction and detection circuits in a first portion of the communication path exceeds a reference value, the host controller is further configured to change the error correction capability for the first portion of the communication path in a different operation from the setting the error correction capability in accordance with the errors caused in the communication path and examined by using the training pattern.

12. The communication system of claim 1, wherein the training pattern is known to the host controller and each of the communication devices.

13. A communication device comprising:
a reception circuit configured to receive a first communication frame for serial communications from a communication path configured to couple a host controller and a plurality of communication devices in a ring shape;
a transmission circuit configured to transmit the communication frame to the communication path;
an error correction and detection circuit configured to perform error correction and detection and has a variable error correction capability; and
a controller circuit configured to set the error correction capability of the error correction and detection circuit using a known training pattern in accordance with an instruction from the host controller.

14. A communication method in a communication system including a host controller including a first error correction and detection circuit configured to perform error correction and detection and has a variable error correction capability, a plurality of communication devices each including a second error correction and detection circuit which is configured to perform error correction and detection and which has a variable error correction capability, and a communication path coupling the host controller and the communication devices in a ring shape and configured to transmit a communication frame for serial communications,
the communication method comprising:
outputting a training pattern from the host controller and each of the communication devices;
examining errors caused in the communication path based on the training pattern; and
setting an error correction capability of each of the first error correction and detection circuit and the second error correction and detection circuits in accordance with the errors caused in the communication path.

15. The communication method of claim 14,
wherein if a first number of errors are caused in a first portion of the communication path and a second number of errors are caused in a second portion of the communication path, the second number being larger than the first number, the communication method further comprises applying an error correction capability adaptable to the second number of errors to the first portion and the second portion.

16. The communication method of claim 14,
wherein if a first number of errors are caused in a first portion of the communication path and a second number of errors are caused in a second portion of the communication path, the second number being larger than the first number, the communication method further comprises:
applying a first error correction capability adaptable to the first number of errors to the first portion; and
applying a second error correction capability adaptable to the second number of errors to the second portion.

17. The communication method of claim 16, wherein:
first data to which the first error correction capability is applied has a first size; and second data to which the second error correction capability is applied has a second size that is larger than the first size;

the communication method further comprises:

communicating the first data at a first speed; and communicating the second data at second speed that is higher than the first speed.

18. The communication method of claim 14, wherein if an error correction frequency or a retransmission frequency of the communication frame in one of the first error correction and detection circuit and the second error correction and detection circuits in a first portion of the communication path exceeds a reference value, the communication method further comprises changing the error correction capability for the first portion of the communication path and a second portion different from the first portion thereof, in a different operation from the setting the error correction capability in accordance with the errors caused in the communication path and examined by using the training pattern.

19. The communication method of claim 14, wherein if an error correction frequency or a retransmission frequency of the communication frame in one of the first error correction and detection circuit and the second error correction and detection circuits in a first portion of the communication path exceeds a reference value, the communication method further comprises changing the error correction capability for the first portion of the communication path, in a different operation from the setting the error correction capability in accordance with the errors caused in the communication path and examined by using the training pattern.

20. The communication method of claim 14, wherein the training pattern is known to the host controller and each of the communication devices.

* * * * *